US008497199B1

(12) United States Patent
Jan et al.

(10) Patent No.: US 8,497,199 B1
(45) Date of Patent: Jul. 30, 2013

(54) METHOD FOR FABRICATING A THIN FILM FORMED WITH A UNIFORM SINGLE-SIZE MONOLAYER OF SPHERICAL AZO NANOPARTICLES

(75) Inventors: Der-Jun Jan, Taoyuan County (TW); Shih-Shou Lo, Taoyuan County (TW); Chen-Yu Lin, Taoyuan County (TW)

(73) Assignee: Institute of Nuclear Energy Research Atomic Energy Council, Executive Yuan, Taoyuan County (TW)

( * ) Notice: Subject to any disclaimer, the term of this patent is extended or adjusted under 35 U.S.C. 154(b) by 0 days.

(21) Appl. No.: 13/569,371

(22) Filed: Aug. 8, 2012

(30) Foreign Application Priority Data

Jun. 1, 2012 (TW) .............................. 101119789 A

(51) Int. Cl.
*H01L 21/44* (2006.01)
(52) U.S. Cl.
USPC ............ 438/609; 257/E31.126; 257/E33.064; 429/532; 977/776; 977/811; 977/834
(58) Field of Classification Search
USPC .... 257/E31.126, E33.064; 429/532; 438/609; 977/776, 811, 834
See application file for complete search history.

(56) References Cited

U.S. PATENT DOCUMENTS

| | | | |
|---|---|---|---|
| 2005/0126338 A1* | 6/2005 | Yadav ............................. | 75/255 |
| 2010/0230517 A1* | 9/2010 | Yadav et al. ..................... | 241/23 |
| 2011/0165409 A1* | 7/2011 | Bories-Azeau et al. ....... | 428/323 |
| 2011/0186125 A1* | 8/2011 | Agui et al. ..................... | 136/256 |
| 2012/0164450 A1* | 6/2012 | Soloukhin et al. ............. | 428/402 |
| 2012/0164561 A1* | 6/2012 | Yadav ............................. | 429/530 |
| 2013/0000952 A1* | 1/2013 | Srinivas et al. ............. | 174/126.1 |
| 2013/0037094 A1* | 2/2013 | Wang et al. ..................... | 136/256 |
| 2013/0056244 A1* | 3/2013 | Srinivas et al. ............... | 174/250 |
| 2013/0078460 A1* | 3/2013 | Tasaka et al. ................. | 428/339 |
| 2013/0087363 A1* | 4/2013 | Oh et al. ..................... | 174/126.1 |

* cited by examiner

*Primary Examiner* — Asok K Sarkar
(74) *Attorney, Agent, or Firm* — WPAT, PC; Justin King

(57) ABSTRACT

The present invention relates to a method for fabricating a thin film formed with a uniform single-size monolayer of spherical AZO nanoparticles. Because of its own advantages in cost and transparency, Al-doped ZnO (AZO) transparent conductive film is becoming the most commonly used transparent conducting oxide (TCO) replacement for solar cells. In this invention, a colloidal chemical means is adopted for enabling a chemical reaction between metal salts, water, and polyhydric alcohols at a room-temperature environment, and thereby, a process for fabricating spherical AZO nanoparticles in a diameter ranged between 100 nm to 400 nm according to different parameter configurations can be achieved while controlling the actual Al/Zn ratio to be ranged between 0.1% to 3%. In addition, a dip coating means is adopted for densely distributing the spherical AZO nanoparticles on a substrate into a monolayer close-packed structure.

8 Claims, 2 Drawing Sheets

METHOD FOR FABRICATING A THIN FILM FORMED WITH A UNIFORM SINGLE-SIZE MONOLAYER OF SPHERICAL AZO NANOPARTICLES

FIELD OF THE INVENTION

The present invention relates to a method for fabricating a thin film formed with a uniform single-size monolayer of spherical AZO nanoparticles, and more particularly, a colloidal chemical means is adopted in the present invention for enabling a chemical reaction between metal salts, water, and polyhydric alcohols at a room-temperature environment, so as to achieve a process for fabricating spherical AZO nanoparticles in a diameter ranged between 100 nm to 400 nm according to different parameter configurations.

BACKGROUND OF THE INVENTION

In order to reduce the generation of manmade greenhouse gases and also considering the depletion of conventional sources of energy like coal and oil, more and more green energy technologies had been developed and among which solar power is considered to be one of the most promising renewable energy sources in the world. However, since the thin film crystalline silicon solar cell that are currently available are still poor in performance efficiency and are very expensive to built, each unit of electricity cost from solar power is higher than those of conventional thermal power plants and nuclear power plants, so that solar power is not yet being used as our main source of electricity. The best way for making solar cells to become more popular is to improve the solar cell's efficiency for lowering power generation cost without causing any increment in its manufacturing cost and complexity, which is becoming the focus point in the recent thin film solar cell (TFSC) development for achieving a novel thin film solar cell with low material requirement. In order to effectively enhancing the internal quantum efficiency and the absorption of solar spectrum, a light trapping structure with specific diffusion characteristic had been studied and provided, using which the light incident to a thin film solar cell at critical angles is refracted and reflected multiple times for greatly increasing the probability of absorption, and thus the energy conversion efficiency of the thin film solar cell is improved.

Nevertheless, it is known that almost all the technologies and related manufacturing processes of thin film solar cell with light trapping structure are already being thoroughly studied and developed by those advanced countries, not to mention the related studies in light trapping based on nanoengineering. Therefore it can be very costly for those new corners to the solar cell industry since they are going to face very high royalty payments and may even fall into "the money pit game", such as what was happening to the TFT LCD and DRAM industries in Taiwan. Hence, it is important for those new corners to develop its own novel manufacturing processes with reduced cost.

There are already all kinds of light trapping structures available on the market. One of which is a submicrometer grating, that is to be formed on a back surface reflector of a solar cell and used for increasing the optically effective cell thickness by approximately a factor of 5. However, such submicrometer grating is difficult to fabricate, not to mention the fabricating of a large-area submicrometer grating. In 1998, a novel porous silicon backside light reflector for thin silicon solar cells was provided by Zettner et al., using which the photoelectric current from the solar cell is increased by about 20%. However, to produce such porous reflector on solar cell effectively will require a process with very precise parameter control. Moreover, another conventional light trapping structure is achieved by texturing the incident surface of silicon solar cells, in that the textured surface is formed on the incident surface of a solar cell by a lithography process, a dry-etching process, or a wet-etching process. However, the forming of the textured surface by the lithography process is disadvantageous in that: not only the equipment for those production processes can be very expensive as the equipment should be large enough for producing large-area textured surfaces, but also the performing of those production processes can be very time-consuming and costly. Thus, it is in need of a novel light trapping structure without the aforesaid shortcomings.

SUMMARY OF THE INVENTION

In view of the disadvantages of prior art, the primary object of the present invention is to provide a method for fabricating a thin film formed with a uniform single-size monolayer of spherical AZO nanoparticles. Because of its advantages in cost and transparency, Al-doped ZnO (AZO) transparent conductive film is becoming the most commonly used transparent conducting oxide (TCO) replacement for solar cells. In this invention, a colloidal chemical means is adopted for enabling a chemical reaction between metal salts, water, and polyhydric alcohols at a room-temperature environment, and thereby, a process for fabricating spherical AZO nanoparticles in a diameter ranged between 100 nm to 400 nm according to different parameter configurations can be achieved while controlling the actual Al/Zn ratio to be ranged between 0.1% to 3%. In addition, a dip coating means is adopted for densely distributing the spherical AZO nanoparticles on a substrate into a monolayer close-packed structure.

To achieve the above object, the present invention provides a method for fabricating a thin film formed with a uniform single-size monolayer of spherical AZO nanoparticles, comprising the steps of:

mixing a material of zinc acetate, a material of aluminum acetate and a material of diethylene glycol so as to form a first solution while placing the first solution into a container to be heated to a predefined temperature for a first predefined period of time;

cooling the first solution in the container to a room temperature;

using a centrifugal apparatus for performing a high-speed centrifugal process upon the first solution so as to extract and obtain an upper layer solution from a centrifugal tube of the centrifugal apparatus to be used as a seed solution for posterior steps;

mixing a material of zinc acetate, a material of aluminum acetate, a material of diethylene glycol and the seed solution so as to form a second solution while placing the second solution into the container to be heated to a predefined temperature for a second predefined period of time;

cooling the second in the container to a room temperature;

using the centrifugal apparatus for performing a high-speed centrifugal process upon the second solution so as to extract and obtain a lower-layer sediment from the centrifugal tube of the centrifugal apparatus;

using a deionized water to rinse the lower-layer sediment; and soaking the lower-layer sediment after rinsing into a solution of anhydrous alcohol so as to form spherical aluminum-doped zinc oxide (AZO) nanoparticles.

Preferably, the second predefined period of time is twice of the first predefined period of time.

Preferably, the second predefined period of time is one hour, while the first predefined period of time is half an hour.

Preferably, the lower-layer sediment is a white material.

Preferably, the spherical aluminum-doped zinc oxide (AZO) nanoparticles are nanospheres that are formed in a singular and isolated manner.

Preferably, the method for fabricating a thin film formed with a uniform single-size monolayer of spherical AZO nanoparticles, comprising the step of:

mixing the spherical AZO nanoparticles into a solution of ethanol and diethylene glycol mixed in a specific proportion while using a blender to stir the mixed solution fully so as to obtain a dispersion solution; and the dipping a substrate vertically into the dispersion solution and then controlling the substrate to be lift at a lifting speed suitable for enabling the spherical AZO nanoparticles to attached uniformly on the substrate.

Preferably, the method for fabricating a thin film formed with a uniform single-size monolayer of spherical AZO nanoparticles, comprising the step of:

placing the substrate with the spherical AZO nanoparticles attached thereon into a cavity to be processed by a zinc oxide (ZnO) coating process so as to control and form a thin film on the substrate in a thickness not larger than the diameter of one AZO nano particle, and thus achieve a thin film embedded with a monolayer of spherical AZO nanoparticles.

Preferably, the diameter of the spherical AZO nanoparticles that are obtained from the soaking of the sediment in the solution of anhydrous alcohol is ranged between 100 nm and 300 nm, and the spherical AZO nanoparticles is formed in a doping concentration ranged between 0.1% and 3%.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
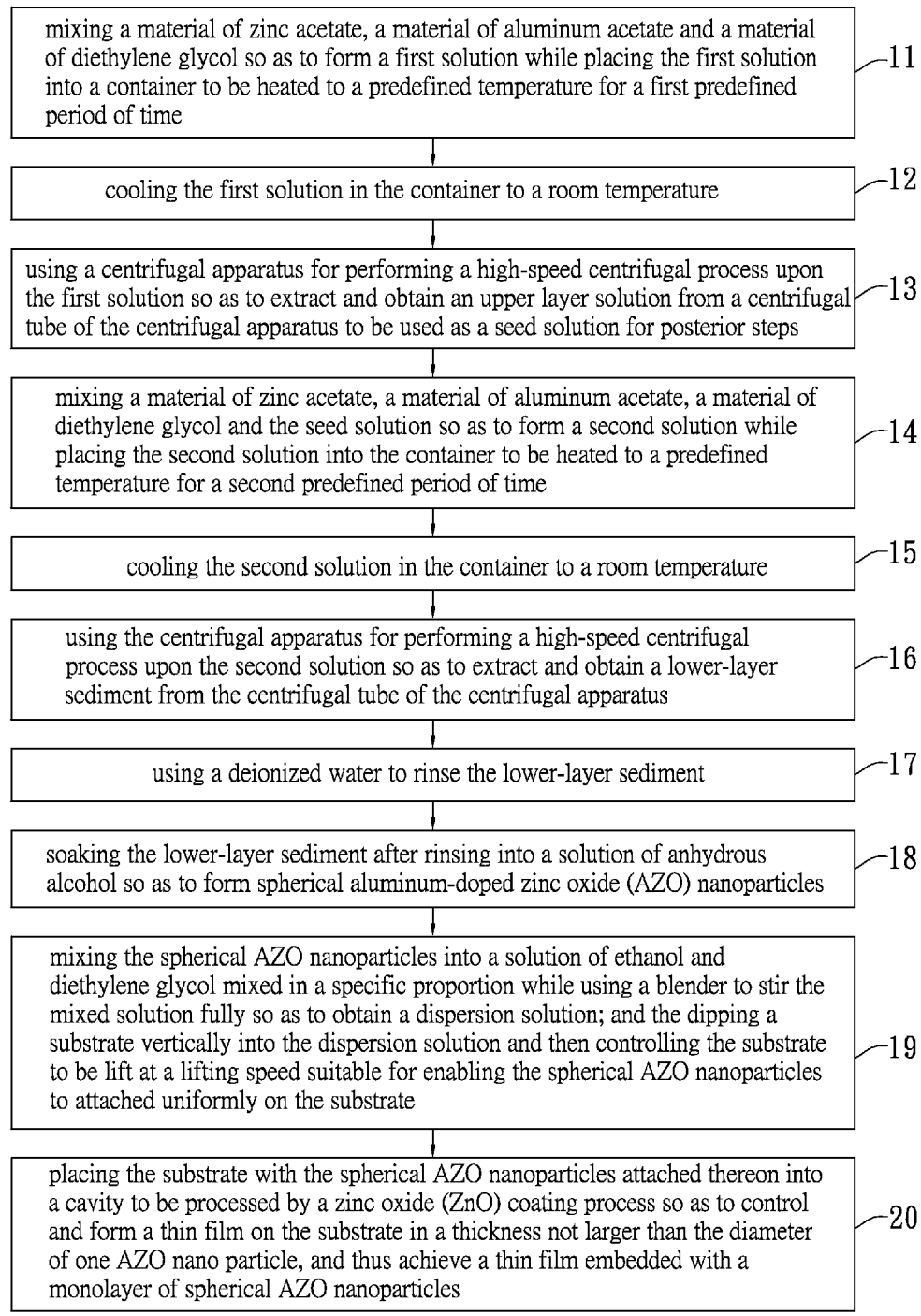
FIG. 1 is a flow chart depicting the steps performed in a method for fabricating a thin film formed with a uniform single-size monolayer of spherical AZO nanoparticles according to the present invention.

Please refer to FIG. 1, which is a flow chart depicting the steps performed in a method for fabricating a thin film formed with a uniform single-size monolayer of spherical AZO nanoparticles according to the present invention. As show in FIG. 1, the method for fabricating a thin film formed with a uniform single-size monolayer of spherical AZO nanoparticles comprises the following steps:

step 11: mixing a material of zinc acetate, a material of aluminum acetate and a material of diethylene glycol so as to form a first solution while placing the first solution into a container to be heated to a predefined temperature for a first predefined period of time;

step 12: cooling the first solution in the container to a room temperature;

step 13: using a centrifugal apparatus for performing a high-speed centrifugal process upon the first solution so as to extract and obtain an upper layer solution from a centrifugal tube of the centrifugal apparatus to be used as a seed solution for posterior steps;

step 14: mixing a material of zinc acetate, a material of aluminum acetate, a material of diethylene glycol and the seed solution so as to form a second solution while placing the second solution into the container to be heated to a predefined temperature for a second predefined period of time;

step 15: cooling the second solution in the container to a room temperature;

step 16: using the centrifugal apparatus for performing a high-speed centrifugal process upon the second solution so as to extract and obtain a white lower-layer sediment from the centrifugal tube of the centrifugal apparatus;

step 17: using a deionized water to rinse the lower-layer sediment;

step 18: soaking the lower-layer sediment after rinsing into a solution of anhydrous alcohol so as to form spherical aluminum-doped zinc oxide (AZO) nanoparticles, whereas the spherical aluminum-doped zinc oxide (AZO) nanoparticles formed in step 18 are nanospheres distributed in a singular and isolated manner and the diameter of the spherical AZO nanoparticles that are obtained from the soaking of the sediment in the solution of anhydrous alcohol is ranged between 100 nm and 300 nm, and the spherical AZO nanoparticles is formed in a doping concentration ranged between 0.1% and 3%;

step 19: mixing the spherical AZO nanoparticles into a solution of ethanol and diethylene glycol mixed in a specific proportion while using a blender to stir the mixed solution fully so as to obtain a dispersion solution; and the dipping a substrate vertically into the dispersion solution and then controlling the substrate to be lift at a lifting speed suitable for enabling the spherical AZO nanoparticles to attached uniformly on the substrate; and step 20: placing the substrate with the spherical AZO nanoparticles attached thereon into a cavity to be processed by a zinc oxide (ZnO) coating process so as to control and form a thin film on the substrate in a thickness not larger than the diameter of one AZO nano particle, and thus achieve a thin film embedded with a monolayer of spherical AZO nanoparticles.

It is noted that the second predefined period of time is twice of the first predefined period of time, whereas in one embodiment of the present invention, the second predefined period of time is one hour, while the first predefined period of time is half an hour.

Operationally, the aforesaid method for fabricating a thin film formed with a uniform single-size monolayer of spherical AZO nanoparticles is composed of three procedures, which are: (1) a procedure for forming a plurality of uniform single-size spherical AZO nanoparticles; (2) a procedure for enabling the plural AZO nanoparticles to be arranged very closely to each other on a substrate so as to form a monolayer close-packed structure in the substrate; (3) a procedure for coating a ZnO thin film on the substrate while allowing the plural AZO nanoparticles to embed therein.

In an exemplary embodiment of the present invention, the procedure for forming a plurality of uniform single-size spherical AZO nanoparticles comprises the following stages:

(a) placing a mix solution of aluminum salt, zinc acetate and diethylene glycol into a circulation apparatus so as to be heated to 170° C. to enable a chemical reaction, and then the reactants of the chemical reaction is extracted while preserving the remaining solution for later use, as reference to the step 11 to step 13 of FIG. 1; and (b) repeating stage (a), but as soon as the temperature of the mix solution reaches 140° C., the remaining solution preserved from the step (a) is added into the mixed solution while allowing the combined solution to be heated to 170° C. for about an hour to enable a chemical reaction, and then the reactants of the chemical reaction is extracted to be rinsed by a solution of anhydrous alcohol, as reference to the step 14 to step 18 of FIG. 1.

It is noted that at the stage (a), there are micro crystals being formed so as to be used as nucleuses in the following stage (b); and at the stage (b), the size of the resulting spherical AZO nanoparticles is controlled by the introduction of the remaining solution.

Figure 2:
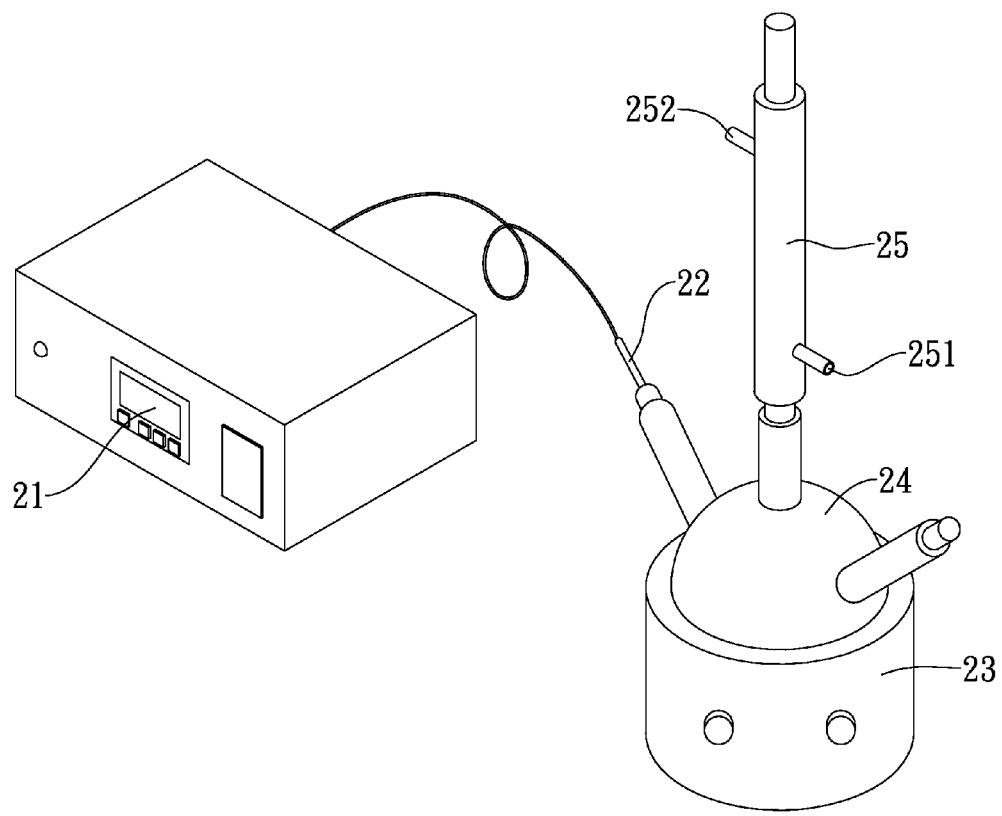
FIG. 2 is a schematic diagram showing an apparatus for fabricating a thin film formed with a uniform single-size monolayer of spherical AZO nanoparticles according to the present invention.

Please refer to FIG. 2, which is a schematic diagram showing an apparatus for fabricating a thin film formed with a uniform single-size monolayer of spherical AZO nanoparticles according to the present invention. As shown in FIG. 2, the fabrication apparatus comprises: a temperature control unit 21, a temperature control rod 22, a heating blender 23, a three-neck flask 24, and a condenser tube 25, in which the condenser tube 25 is further formed with: an inlet 251 and an outlet 252. Moreover, the circulation apparatus in the aforesaid stage (a) is used for stirring the mix solution to flow and circulate so as to maintain a stable and uniformly distributed reaction temperature in the mix solution, and the reactants of the stage (b) is extracted using a centrifugal apparatus and then is to be rinsed by the anhydrous alcohol so as to obtain spherical AZO nanoparticles of various doping concentrations.

For the procedure for enabling the plural AZO nanoparticles to be arranged very closely to each other on a substrate so as to form a monolayer close-packed structure in the substrate, it is performed basically by the step 19 shown in FIG. 1, in which the spherical AZO nanoparticles are mixed into a solution of ethanol and diethylene glycol mixed in a specific proportion while using a blender to stir the mixed solution fully so as to obtain a dispersion solution; and the dipping a substrate, that can be made of a conductive material or a non-conductive material, vertically into the dispersion solution and then controlling the substrate to be lift at a lifting speed suitable for enabling the spherical AZO nanoparticles to attached uniformly on the substrate.

For the procedure for coating a ZnO thin film on the substrate while allowing the plural AZO nanoparticles to embed therein, it is performed basically by the step 20 shown in FIG. 1, in which the substrate with the spherical AZO nanoparticles attached thereon is placed into a cavity to be processed by a zinc oxide (ZnO) coating process so as to control and form a thin film on the substrate in a thickness not larger than the diameter of one AZO nano particle, and thus achieve a thin film embedded with a monolayer of spherical AZO nanoparticles that is featured by a specific light diffusion characteristic and light trapping ability.

The thin film formed with a uniform single-size monolayer of spherical AZO nanoparticles that is achieved using the fabrication method of the invention has the following advantages:

(1) the spherical AZO nanoparticles formed using the fabrication method of the invention are uniform nanospheres with the same size in diameter range between 100 nm and 400 nm, and at a fixed Al/Zn ratio ranged between 0.1% to 3%.

(2) A dip coating process is used for arranging the plural spherical AZO nanoparticles of various doping concentration on a glass substrate or a flexible stainless steel substrate very closely to each other so as to achieve a monolayer close-packed structure, whereas the monolayer close-packed structure of the plural spherical AZO nanoparticles is being embedded in a ZnO thin film so as to construct an effective large-scale light trapping structure.

(3) The thin film of the present invention is simple to fabricate at a comparatively low cost, and moreover, it can be easily integrated with advanced solar cells, such as ultra-thin solar cells, dye-sensitized solar cells (DSSC), organic solar cells, organic-inorganic hybrid solar cells, and quantum dots solar cells. Thus, after being structurally optimized and experimental proven, the thin film of the present invention can be applied in various applications.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A method for fabricating a thin film formed with a uniform single-size monolayer of spherical AZO nanoparticles, comprising the steps of:

step A: mixing a material of zinc acetate, a material of aluminum acetate and a material of diethylene glycol so as to form a first solution while placing the first solution into a container to be heated to a predefined temperature for a first predefined period of time;

step B: cooling the first solution in the container to a room temperature;

step C: using a centrifugal apparatus for performing a high-speed centrifugal process upon the first solution so as to extract and obtain an upper layer solution from a centrifugal tube of the centrifugal apparatus to be used as a seed solution for posterior steps;

step D: mixing a material of zinc acetate, a material of aluminum acetate, a material of diethylene glycol and the seed solution so as to form a second solution while placing the second solution into the container to be heated to a predefined temperature for a second predefined period of time;

step E: cooling the second solution in the container to a room temperature;

step F: using the centrifugal apparatus for performing a high-speed centrifugal process upon the second solution so as to extract and obtain a lower-layer sediment from the centrifugal tube of the centrifugal apparatus;

step G: using a deionized water to rinse the lower-layer sediment; and step H: soaking the lower-layer sediment after rinsing into a solution of anhydrous alcohol so as to form spherical aluminum-doped zinc oxide (AZO) nanoparticles.

2. The method of claim 1, wherein the second predefined period of time is twice of the first predefined period of time.

3. The method of claim 2, wherein the second predefined period of time is one hour, while the first predefined period of time is half an hour.

4. The method of claim 1, wherein the lower-layer sediment is a white material.

5. The method of claim 1, wherein the spherical aluminum-doped zinc oxide (AZO) nanoparticles formed in step H are nanospheres distributed in a singular and isolated manner.

6. The method of claim 1, further comprising the step of:

step I: mixing the spherical AZO nanoparticles into a solution of ethanol and diethylene glycol mixed in a specific proportion while using a blender to stir the mixed solution fully so as to obtain a dispersion solution; and the dipping a substrate vertically into the dispersion solution and then controlling the substrate to be lifted at a lifting speed suitable for enabling the spherical AZO nanoparticles to attached uniformly on the substrate.

7. The method of claim 1, further comprising the step of:

step J: placing the substrate with the spherical AZO nanoparticles attached thereon into a cavity to be processed by a zinc oxide (ZnO) coating process so as to control and form a thin film on the substrate in a thickness not larger than the diameter of one AZO nano particle, and thus achieve a thin film embedded with a monolayer of spherical AZO nanoparticles.

8. The method of claim 1, wherein the diameter of the spherical AZO nanoparticles that are obtained from the soaking of the sediment in the solution of anhydrous alcohol is ranged between 100 nm and 300 nm, and the spherical AZO nanoparticles is formed in a doping concentration ranged between 0.1% and 3%.

* * * * *